United States Patent [19]

Beijer

[11] Patent Number: 5,295,043

[45] Date of Patent: Mar. 15, 1994

[54] CLIP-ON HEAT SINK AND METHOD OF COOLING A COMPUTER CHIP PACKAGE

[75] Inventor: Gene Beijer, Moorpark, Calif.

[73] Assignee: Tandon Corporation, Moorpark, Calif.

[21] Appl. No.: 830,057

[22] Filed: Feb. 3, 1992

[51] Int. Cl.$^5$ ............................................. H05K 7/20
[52] U.S. Cl. ................... 361/704; 361/756; 361/752; 165/185; 257/720; 174/16.3
[58] Field of Search ............. 361/381, 383, 386, 388, 361/389, 392, 394, 399, 403, 411, 418, 702–704, 709, 711, 715, 730, 707, 714, 752, 767, 765, 756; 165/80.3, 185; 357/79, 80, 81; 174/16.3; 439/487; 257/720, 723

[56] References Cited

U.S. PATENT DOCUMENTS

| | | | |
|---|---|---|---|
| 4,345,267 | 8/1982 | Corman et al. | 357/81 |
| 4,594,643 | 6/1986 | Hermann . | |
| 4,679,118 | 7/1987 | Johnson et al. | 361/386 |
| 4,716,494 | 12/1987 | Bright et al. | 361/386 |

FOREIGN PATENT DOCUMENTS

| | | |
|---|---|---|
| 3304952 | 8/1984 | Fed. Rep. of Germany . |
| 3335332 | 4/1985 | Fed. Rep. of Germany . |
| 3335377 | 4/1985 | Fed. Rep. of Germany . |
| 3335644 | 4/1985 | Fed. Rep. of Germany . |

OTHER PUBLICATIONS

European Search Report dated Mar. 29, 1993.
Computer Design Magazin, p. 73; EG&G Wakefield Engineering Series heat sink/clip assembly—Feb. 1992.
Semiconductor Accessories Brochure; Thermalloy, Inc., Dec. 1990.

*Primary Examiner*—Leo P. Picard
*Assistant Examiner*—Young Whang
*Attorney, Agent, or Firm*—Davis Hoxie Faithfull & Hapgood

[57] ABSTRACT

A low-profile, clip-on heat sink for computer chip packages that releasably engages the side of the package and method for cooling computer chips is disclosed. The sink comprises a contact pad attached to a set of beams. Flanges extend down from the outer edges of the beams. The sink is engaged to the package by the flanges which attach to the sides of the package. When the sink is engaged to the package, the contact pad contacts the computer chip. When the chip is operating, heat flows from the chip to the contact pad. Heat then flows from the contact pad to the beams where it dissipates into the ambient surroundings. The sink may be released from engagement by deforming the flanges.

19 Claims, 2 Drawing Sheets

CLIP-ON HEAT SINK AND METHOD OF COOLING A COMPUTER CHIP PACKAGE

FIELD OF THE INVENTION

The present invention relates to heat sinks, and more particularly, to a low-profile, clip-on heat sink for a computer chip package and to a method of cooling a computer chip package.

BACKGROUND OF THE INVENTION

Computer chip packages comprise microchips embedded in ceramic pin grid arrays ("PGA"). Pins extend out of the PGA which carry signals to and from the microchip. The pins are inserted into a chip socket in order to operate the microchip. Microchips generate substantial amounts of heat which can lead to malfunction from cycling problems. In order to reduce the heat in microchips, heat sinks have been devised to carry heat away from the microchip and from the chip package. Typically, these devices are sets of fins or lances attached by an epoxy adhesive to the back of the microchip package. The epoxy adhesive must be carefully chosen such that chip breakage does not result due to a mismatch in thermal expansion rates of the package and the epoxy. Once the heat sink is thus affixed to the chip, it is not easily removed, particularly since the package is a delicate device subject to destruction if stressed. Since the identifying marks of the chip are located on the back of the package, once the sink is attached by the epoxy, the chip becomes virtually unidentifiable. This makes servicing the overall system more difficult as a separate record of the chip identities must be maintained. Furthermore, resale of used chips becomes impracticable.

In an attempt to overcome these problems, heat sinks have been developed that mechanically engage the chip package or the chip socket. The Thermalloy PGA E-Z Mount ™ device comprises a rectangular frame in which the PGA sits. In this device, the pins of the PGA run through holes in the frame, keeping the frame in place. Alternatively, two shoes can be attached to opposite sides of the PGA by slipping the pins into holes in the shoes. A spring is attached to a heat sink. The spring then attaches to the frame, holding the heat sink in place against the chip package. There are several drawbacks to these designs. First of all, these devices comprise several parts. In addition, the frame or shoes must be attached before the chip package is mounted onto the chip socket. Finally, the heat sinks for use with this device comprise fins protruding out from the top of the sink, requiring more space.

The Thermalloy 2311 Series Integrated Circuit Heat Sink is a screw-on heat sink. The chip package is mounted on the chip socket. A latch cover is attached to the socket, covering the package. The sink screws into a socket in the latch cover such that the sink is disposed above the chip package.

The present invention relates to a low-profile heat sink (or "sink") for a computer chip package that can be easily mounted and easily removed without harming the microchip or the pin grid array. The sink of this invention permits the package to be mounted on and dismounted from the chip socket while the sink is attached. In addition, the sink can be mounted and dismounted from the package whether or not the package is mounted in the socket.

SUMMARY OF THE INVENTION

The invention is a clip-on heat sink and method for cooling a computer chip package. The sink comprises a heat dissipating means and a contact pad attached to the dissipating means such that heat will transfer from the pad to the dissipating means. An engagement means is mounted on the dissipating means. The dissipating means is clipped by the engagement means into releasable engagement with the sides of a computer chip package away from the pins such that the pad is in contact with a heat source. In a typical chip package, the heat source will be a microchip disposed in the center of the ceramic pin grid array. The heat from the heat source passes to the contact pad. The heat from the contact pad then passes to the dissipating means from which it is transferred to the ambient surroundings. The heat sink can be easily and completely removed without damaging the package or the microchip whether or not the package is mounted in a chip socket.

Preferably, the heat dissipating means, the pad and the engagement means are all formed from a single panel. The dissipating means may be a flat plate having a depression at its center to form the contact pad. The engagement means preferably comprises a set of beams extending out from the contact pad formed by the periphery of the plate. Flanges extend down from the outer edges of the beams. Dimples, preferably shaped as line dimples, are disposed on the inner wall of each flange and can engage the chip package so that the contact pad contacts the microchip and the pins are not interfered with.

The sink is easily removed by deforming the flange, thereby disengaging the dimples from the chip. A notch is disposed in the flange in which a tool, such as a standard screwdriver, can be inserted. As the tool is rotated, it engages and pivots about a tab on the beam, permitting the tool to deform the flange without damaging the chip package.

DETAILED DESCRIPTION

Figure 1:
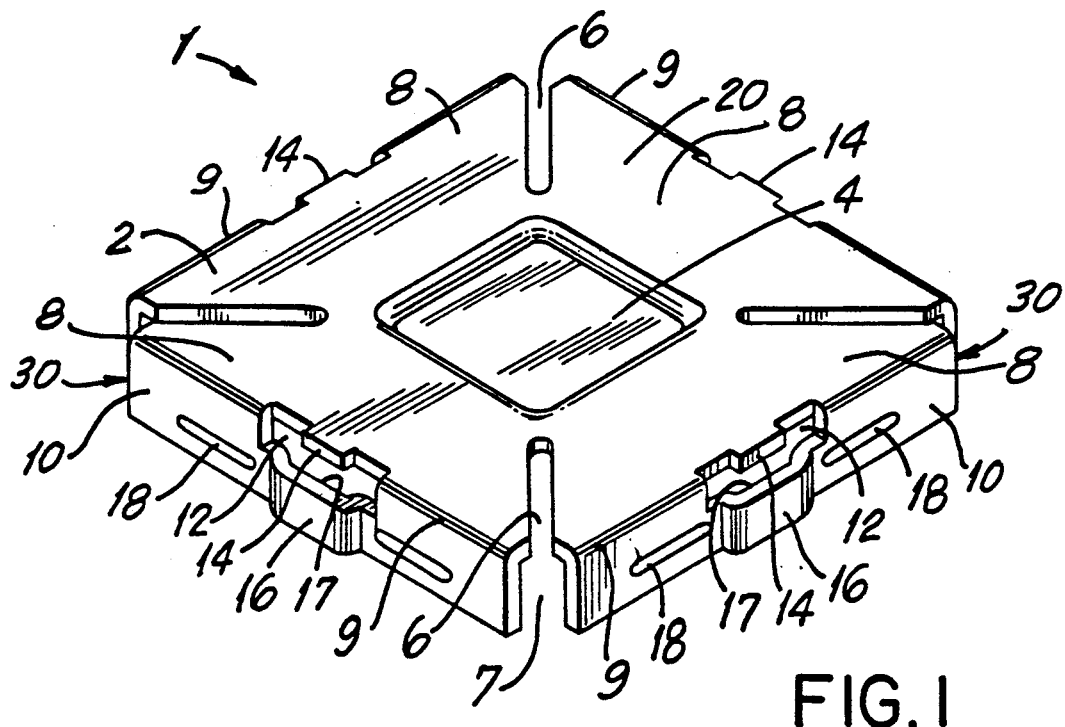
FIG. 1 is a perspective view of the clip-on heat sink of the invention.
Figure 3:
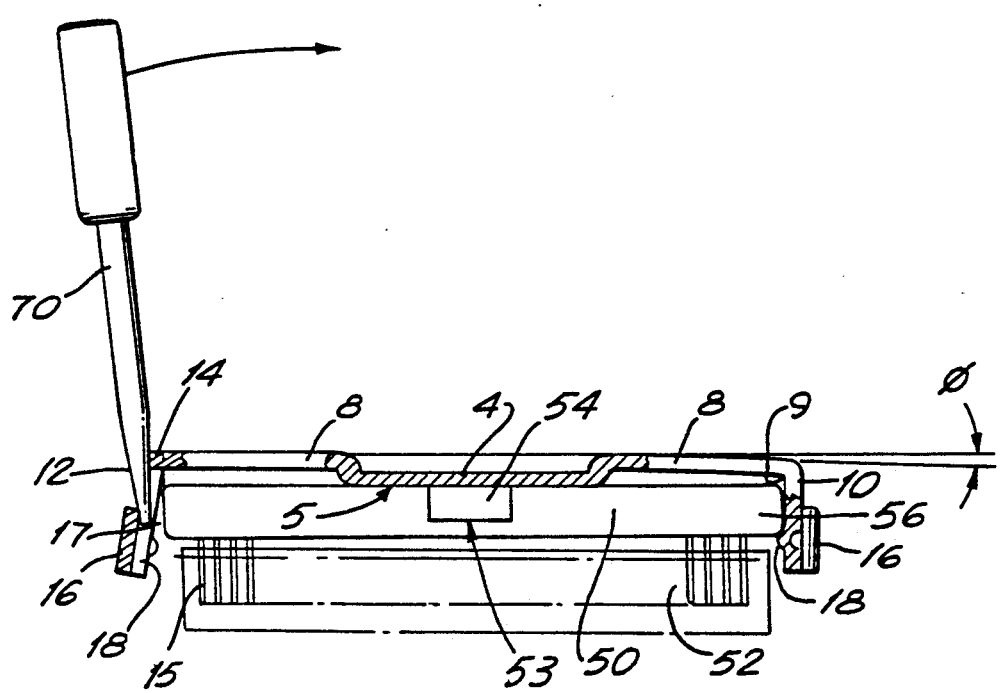
FIG. 3 is a side view, partly in section, of the clip-on heat sink of FIG. 1 mounted on a computer chip package.

FIG. 1 is a perspective view of a preferred, low profile, clip-on heat sink 1 of the invention. As used herein, "clip-on" means that the sink 1 can be mounted on sides of a chip package 50 (FIG. 3) without any epoxy or mounting equipment. A heat dissipation means 20 preferably comprises a substantially flat panel 2 of aluminum that is shaped to have the same general outline as the device to be cooled. However, as described below, any heat dissipation means 20 known in the art would suffice to practice the invention. A contact pad 4 is attached to the heat dissipation means 20 such that heat can flow from the pad to the dissipation means. Preferably, the dissipation means 20 and the contact pad 4 are formed by depressing an area of the panel 2 to form an indentation. Preferably, the profile and contour of the contact surface 5 of the contact pad 4 are shaped to match the profile and contour of the heat source 54 as seen in FIG. 3. However, the contact pad may have a different profile and contour and still practice the invention. Preferably, the contact pad 4 is slightly larger than the heat source 54 such that some heat from a computer chip package 50, as seen in FIG. 3, also passes to the pad. The panel 2 can be anodized, thereby increasing the surface hardness of the contact pad 4. This reduces galling of the contact pad 4.

Slots 6 run through the panel 2, dividing the periphery of the panel into separate beams 8. As described below, the beams 8 permit the panel 2 to flex when mounting the sink 1 to the chip package 50 (FIG. 3). Further, the beams 8 act as leaf springs, ensuring that the contact pad 4 remains in contact with a heat source 54 when the sink 1 is mounted on the chip package 50 (FIG. 3). Preferably, the slots 6 run from the corners of the panel 2 to a point outside the contact pad 4. In this way, the full area of the heat source 54 contacts the pad 4. The slots 6 are preferably designed such that the area of each beam 8 is symmetrical about the contact pad 4 so that heat will flow symmetrically from the pad, thereby facilitating cooling.

The beams 8 extend from near the edges of the contact pad 4 to the edges of the panel 2. An engagement means 30 comprises bend flanges 10 mounted on each beam 8 such that there are four separate flanges. However, the sink 1 would also work with as few as two bend flanges 10 as shown in FIG. 3. Preferably, the bend flanges 10 are attached perpendicularly along the length of an outer edge 9 of each beam 8 by bending down the periphery of each beam (FIG. 3). Openings 7 are formed at the corners of the sink 1 between the flanges 10 which openings facilitate mounting. A notch 12 is disposed in the bend flange 10 at the center of the edge 9 where the beam 8 joins the flange 10. A protrusion tab 14 is mounted on the beam 8 at the edge 9 and extends on the plane of beam into the notch 12.

A joggle 16, formed by bending the bend flange 10 into an arch protruding outwardly from the sink 1, is positioned in the center of each bend flange 10 such that the inner surface 17 of the joggle is disposed about each protrusion tab 14 (FIG. 2) but on the other side of the notch 12 (FIG. 3). As described below, the notch 12, protrusion tab 14 and joggle 16 are used to remove the sink 1 from the chip.

The engagement means 30 further comprises line dimples 18 formed in the bend flanges 10 that protrude inward. As described more fully below with respect to FIG. 3, the line dimples 18 are positioned such that they clip under a chip package 50 while the contact pad 4 engages a heat source 54.

Figure 2:
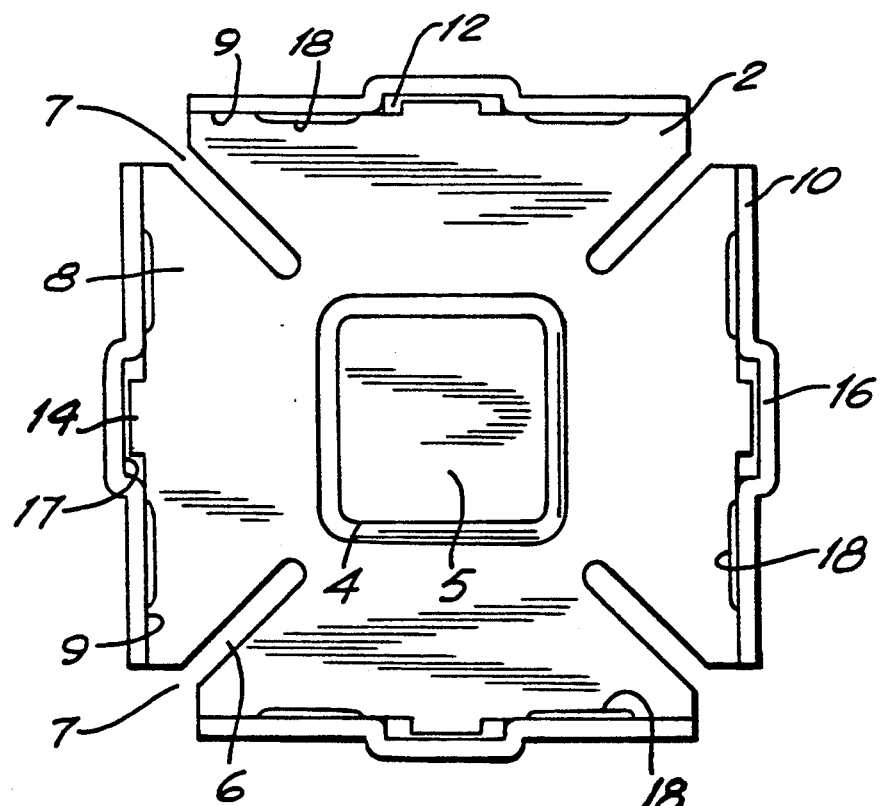
FIG. 2 is a bottom elevational view of the clip-on heat sink of FIG. 1.

FIG. 2 is a bottom view of the low profile, clip-on heat sink of FIG. 1. The beams 8 extend from near the contact pad 4 to the edge of the panel 2. Bend flanges 10 are mounted at the edges 9 of the beams 8. The inner surface 17 of the joggle 16 is disposed about the protrusion tab 14.

FIG. 3 is a side view, partly in section, of the clip-on heat sink of FIG. 1 with two bend flanges 10 mounted on a computer chip package 50. The sink 1 is presently contemplated for use on a 486 microchip manufactured by Intel Corporation.

The package 50 of a 486 chip generally comprises a microchip 53 seated in a ceramic pin grid array ("PGA") 56. The PGA 56 is typically square in profile, approximately 1.75 inches (4.5 cm) on a side. The microchip 53 is also a square in profile, approximately 0.25 inch (0.64 cm) on a side, concentric with and having sides parallel to the PGA 56. Consequently, the panel 2 is shaped as a square, approximately 1.75 (4.5 cm) inches on a side. The pad 4 is a square, approximately 0.62 inches (1.57 cm) on a side. The chip package 50 is mounted onto the chip socket 2 by inserting pins 51 into a chip socket. In a 486 chip, the heat source 54 is the microchip 53.

The bend flanges 10 are substantially perpendicular to the beams 8. The joggle 16 is located at the center of the bend flange 10. The notch 12 is disposed above the joggle 16. The protrusion tab 14 is mounted on the beam 8 so that it extends into the notch 12 and is located proximate to the joggle 16 (see FIG. 1). The contact pad 4 is preferably formed by indenting the panel 2 such that the contact surface 5 has the same contour as the heat source 54 and is disposed lower than the beams 8. In a 486 chip, the back of the microchip is flat so the contact surface is flat.

To mount the heat sink i, the sink is pushed on the chip package 50. The line dimples 18 contact the edge of the PGA 56. The bend flanges 10 deform outwardly and the beams 8 flex concave up as the line dimples 18 slide over the edge of the PGA 56. Once the dimples 18 have passed over the PGA 56, they snap under the edge of the PGA. Now the contact pad 4 is in contact with the heat source 54. The sink 1 is prevented from slipping off the package 50 as a result of the line dimples 18 engaging the package and the contact pad 4 engaging the heat source 54.

Mounting the sink 1 on a chip package 50 causes the beams 8 to deflect by an angle $\phi$, which is 1–2 degrees, preferably slightly over 1°, shown exaggerated for clarity in FIG. 3. The beams 8 therefore act as leaf springs, exerting force on the contact pad 4, pushing the contact surface 5 onto the chip package 50 at the point where the microchip 53 is located. It has been found that the heat sink 1 operates best with a 486 chip package when each beam 8 imparts a constant force of 2–6 pounds, to the contact pad 4. Force is only exerted by the beams 8 that engage the package 50. Since use of four beams 8 is preferred, a total of 8–24 pounds is imparted on the contact pad 4 by all the beams 8 in the preferred embodiment. The force should not ordinarily be greater than 24 pounds so that high stresses which may impair the operation of the microchip 53 are avoided.

Once mounted, the heat from the heat source 54 passes into the contact surface 5 of the contact pad 4. From the contact pad 4, the heat transfers along the beams 8, where it dissipates into the atmosphere. Since the heat transfers equally to each beam 8, cooling is optimized.

The heat sink 1 is releasably engaged with the chip package, that is, the sink 1 can be removed with simple tools whether or not the package 50 is mounted on the socket 52 without use of chemicals and without damaging the chip. To remove the sink 1, a pry bar 70 is inserted in the notch 12 as shown in FIG. 3. The tip of the pry bar 70 slides between the inner surface 17 of the joggle 16 and the PGA 56. The top of the bar 70 is then rotated toward the center of the package 50 as indicated by the arrow in FIG. 3. The body of the bar 70 contacts the protrusion tab 14 as the bar pivots about the tab, such that the tip forces the joggle 16 away from the chip package 50. Consequently, the entire bend flange 10 is deformed away from the package 50 such that the line dimples 18 disengage from the package. This process is repeated for all joggles 16. The sink 1 can then be freely lifted from the package 50.

Removing the sink 1 may result in deformation of the bend flanges 10. Because the material, such as aluminum, of the sink 1 is preferably soft, it can be reformed generally by hand.

Figure 4:
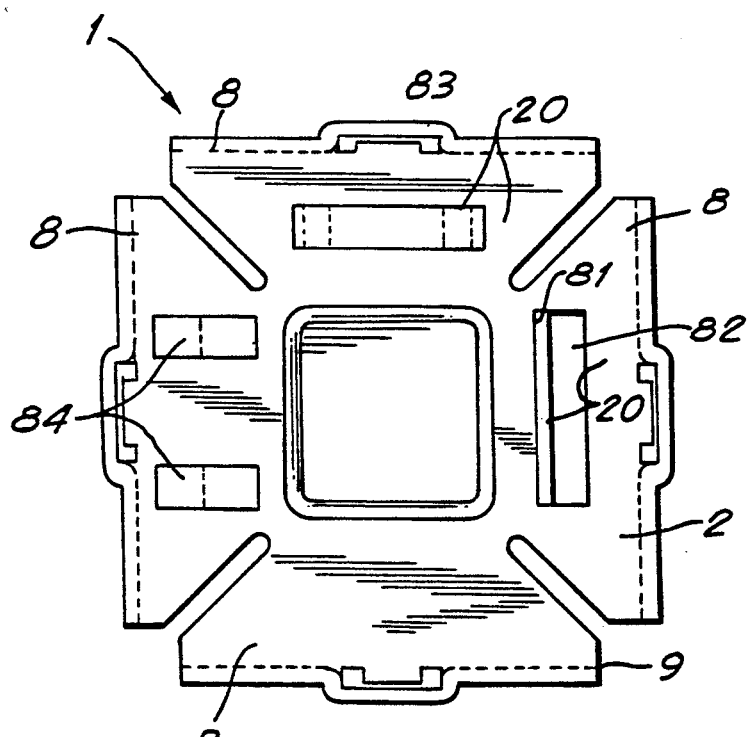
FIG. 4 is a top elevational view of another embodiment of the clip-on heat sink of the invention.

FIG. 4 is a top view of another embodiment of the heat sink 1 of this invention, less preferred than the embodiment described above. Generally, space proximate to a chip package is at a premium so the heat dissipation means 20 should have a low profile. Consequently, use of flat beams 8 as a heat dissipation means is preferred. However, if space is not such a limitation, heat dissipation can be improved by adding fins 81 or lances 83, 84 to the beams 8. Fins and lances are well known in the art and any fin or lance design known in the art could be employed to practice the invention. However, it is preferred that the lances 82 and fins 81 be formed from the panel 2.

A fin 81 is disposed on one beam 8. Preferably, the fin 81 is punched out of the same piece of material as the rest of the sink 1. Consequently, an opening 82 is located adjacent to the fin 81. The location of the fin 81 illustrated in FIG. 4 is purely exemplary. The heat sink 1 of this invention can be practiced using a fin 81 on each beam 8, or a set of fins on each beam extending perpendicularly to the edge 9 of the beam or other configurations well-known in the art.

Also shown in FIG. 4 is a lance 83, disposed on one beam 8. Preferably, the lance 83 is punched from the single panel 2 as the rest of the sink 1. The position of the lance 83 illustrated in FIG. 4 is purely exemplary. The heat sink 1 of this invention can also be practiced using a lance on each beam 8 or, as shown, a set 84 of lances extending perpendicularly to the edge 9 of the beam or other configurations well-known in the art.

I claim:

1. A heat sink for a computer chip package having a microchip and a pin grid array with pins comprising:
    a heat dissipating means;
    a contact pad attached to the heat dissipating means;
    an engagement means mounted to the heat dissipating means capable of releasably engaging the pin grid array at a point distal to the pins such that the contact pad engages the package at a point proximate to the microchip; and
    a removal means disposed on the heat sink which permits deformation of the engagement means such that it releases the pin grid array wherein the removal means comprises a protrusion tab mounted on the heat dissipating means a joggle mounted on the engagement means and wherein a notch is positioned above the joggle in the engagement means.

2. The heat sink of claim 1 wherein the heat dissipating means, the contact pad and the engagement means comprise an integral piece of heat conductive material.

3. The heat sink of claim 1 wherein the heat dissipating means further comprises beams disposed proximate to the edge of the contact pad.

4. The heat sink of claim 3 wherein lances are mounted on the beams.

5. The heat sink of claim 1 wherein the engagement means is mounted on the periphery of the heat dissipating means.

6. The heat sink of claim 5 wherein the engagement means comprises at least two flanges extending from the heat dissipating means and a means for locking the flanges onto the package disposed at the ends of the flanges.

7. The heat sink of claim 6 wherein the locking means comprises dimples mounted on the flanges.

8. The heat sink of claim 1 wherein the heat dissipating means comprises fins.

9. A clip-on heat sink for a computer chip package having peripheral edges and a heat source comprising:
    a heat dissipating means;
    a contact pad attached to the heat dissipated means such that heat from the heat source flow through the contact pad to the heat dissipating means; and
    an engagement means mounted on the heat dissipating means wherein the engagement means is capable of removably engaging the chip package such that the contact pad contacts the heat source;
    wherein the heat dissipating means comprises beams extending from the contact pad;
    wherein the engagement means includes beams, at least two flanges mounted on the beams and dimples mounted on the flanges which dimples are capable of engaging an edge of the package.

10. The heat sink of claim 9 wherein the heat dissipating means further comprises fins mounted on the beams.

11. The heat sink of claim 9 wherein the heat dissipating means further comprises lances mounted on the beams.

12. The heat sink of claim 9 wherein a notch is disposed in the flanges proximate to the center of the flanges.

13. A heat sink for a computer chip package having a heat source comprising:
    a panel capable of dissipating heat wherein the panel is at least partially divided by slots into at least two separate beams;
    a contact pad mounted on the panel proximate an end of each beam such that heat flow from the contact pad to the beams;
    flanges mounted perpendicularly onto the beams at the end of the beams distal to the contact pad wherein a notch is disposed in the center of the edge of each flange proximate to the beam; and
    dimples mounted on the flanges capable of engaging microchip package such that the contact pad is in contact with the heat source.

14. The sink of claim 13 wherein the panel, the contact pad, the flanges and the dimples comprise an integral piece of heat conductive material.

15. The sink of claim 13 wherein a tab is mounted on the beam and projects into the notch.

16. The sink of claim 13 wherein fins are mounted on the beams.

17. A method of cooling a microchip in a computer chip package having a pin grid array with pins comprising the steps of:
    clipping a panel having a contact pad and a heat dissipation means into releasable engagement with the pin grid array at a point distal to the pins such that the contact pad contacts the package at a point proximate to the microchip wherein the step of clipping includes the steps of elastically deforming flanges mounted at the periphery of the panel;
    sliding dimples mounted on the flanges over the pin grid array; and
    returning the flanges to nondeformed condition;
    transferring heat from the microchip to the contact pad;

transferring heat from the contact pad to the heat dissipation means; and transferring heat from the heat dissipation means to the ambient surroundings.

18. The method of claim 17 further comprising the step of removing the panel from the pin grid array.

19. The method of claim 18 wherein the step of removing the panel comprises inserting a bar between the pin grid array and a joggle mounted on the flanges, rotating the bar, and moving the dimples away from the pin grid array.

* * * * *